United States Patent
Adachi et al.

(10) Patent No.: US 9,618,175 B2
(45) Date of Patent: Apr. 11, 2017

(54) VEHICLE LAMP HAVING A LASER EMITTING ELEMENT

(71) Applicant: Hitachi Maxell, Ltd., Osaka (JP)

(72) Inventors: Kei Adachi, Ibaraki (JP); Masayuki Fukui, Ibaraki (JP); Hiroyuki Nakamura, Ibaraki (JP); Chohei Ono, Ibaraki (JP)

(73) Assignee: HITACHI MAXELL, LTD., Osaka (JP)

( * ) Notice: Subject to any disclaimer, the term of this patent is extended or adjusted under 35 U.S.C. 154(b) by 0 days.

(21) Appl. No.: 14/651,212

(22) PCT Filed: Dec. 17, 2013

(86) PCT No.: PCT/JP2013/083777
§ 371 (c)(1),
(2) Date: Jun. 10, 2015

(87) PCT Pub. No.: WO2014/109187
PCT Pub. Date: Jul. 17, 2014

(65) Prior Publication Data
US 2015/0330591 A1    Nov. 19, 2015

(30) Foreign Application Priority Data

Jan. 9, 2013   (JP) .................................. 2013-001457

(51) Int. Cl.
*F21S 8/10* (2006.01)
*H01S 5/022* (2006.01)
(Continued)

(52) U.S. Cl.
CPC ........... *F21S 48/145* (2013.01); *F21S 48/115* (2013.01); *F21S 48/1145* (2013.01);
(Continued)

(58) Field of Classification Search
None
See application file for complete search history.

(56) References Cited

U.S. PATENT DOCUMENTS

| 2012/0106184 A1 | 5/2012 | Kishimoto et al. |
| 2012/0140501 A1 | 6/2012 | Nakazato et al. |

(Continued)

FOREIGN PATENT DOCUMENTS

| JP | 06-324203 A | 11/1994 |
| JP | 2006-267615 A | 10/2006 |

(Continued)

OTHER PUBLICATIONS

International Search Report PCT/JP2013/083777 dated Mar. 11, 2014 with English translation.

*Primary Examiner* — Britt D Hanley
(74) *Attorney, Agent, or Firm* — McDermott Will & Emery LLP

(57) ABSTRACT

A vehicle lamp includes a phosphor which receives laser light (excitation light) emitted from a semiconductor light-emitting element to emit visible light, a reflector which reflects the visible light (illumination light) emitted from the phosphor forward, and an absorbing member which absorbs excitation light regularly reflected by a surface of the phosphor. A metal plate on which the phosphor is disposed to be inclined to cause the excitation light regularly reflected by the surface of the phosphor to be incident on the absorbing member. An upper end portion of the reflector is disposed at a position lower than a vertical position of the phosphor to prevent the regularly reflected excitation light from being incident on the upper end portion.

8 Claims, 9 Drawing Sheets

(51) Int. Cl.
 *F21Y 101/00* (2016.01)
 *F21Y 115/30* (2016.01)

(52) U.S. Cl.
 CPC ....... *F21S 48/1225* (2013.01); *F21S 48/1305* (2013.01); *F21S 48/1317* (2013.01); *F21S 48/14* (2013.01); *F21S 48/31* (2013.01); *H01S 5/02212* (2013.01); *F21Y 2101/00* (2013.01); *F21Y 2115/30* (2016.08)

(56) References Cited

U.S. PATENT DOCUMENTS

| | | |
|---|---|---|
| 2012/0163009 A1 | 6/2012 | Nakazato et al. |
| 2013/0003400 A1 | 1/2013 | Kijima et al. |
| 2014/0112012 A1 | 4/2014 | Nakazato et al. |

FOREIGN PATENT DOCUMENTS

| | | |
|---|---|---|
| JP | 2012-99281 A | 5/2012 |
| JP | 2012-119170 A | 6/2012 |
| JP | 2012-164585 A | 8/2012 |
| JP | 2012-164586 A | 8/2012 |
| JP | 2012-243727 A | 12/2012 |
| JP | 2013-12358 A | 1/2013 |
| WO | 2014/174652 A1 | 10/2014 |

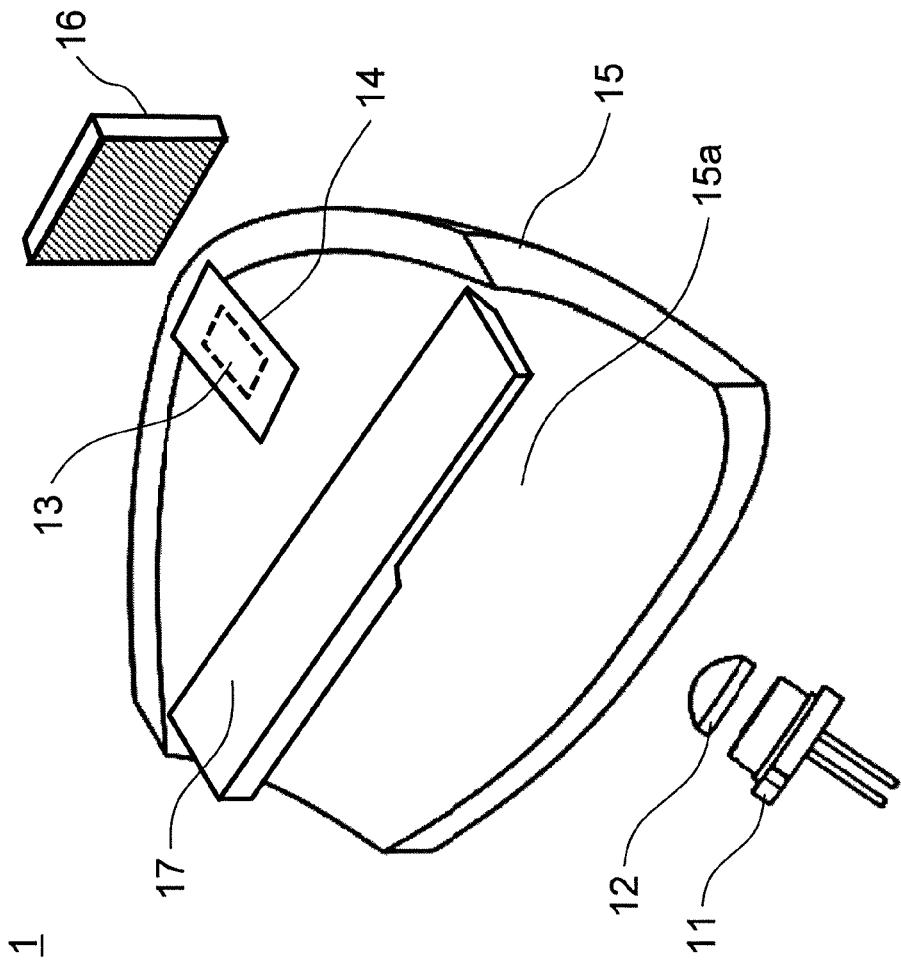

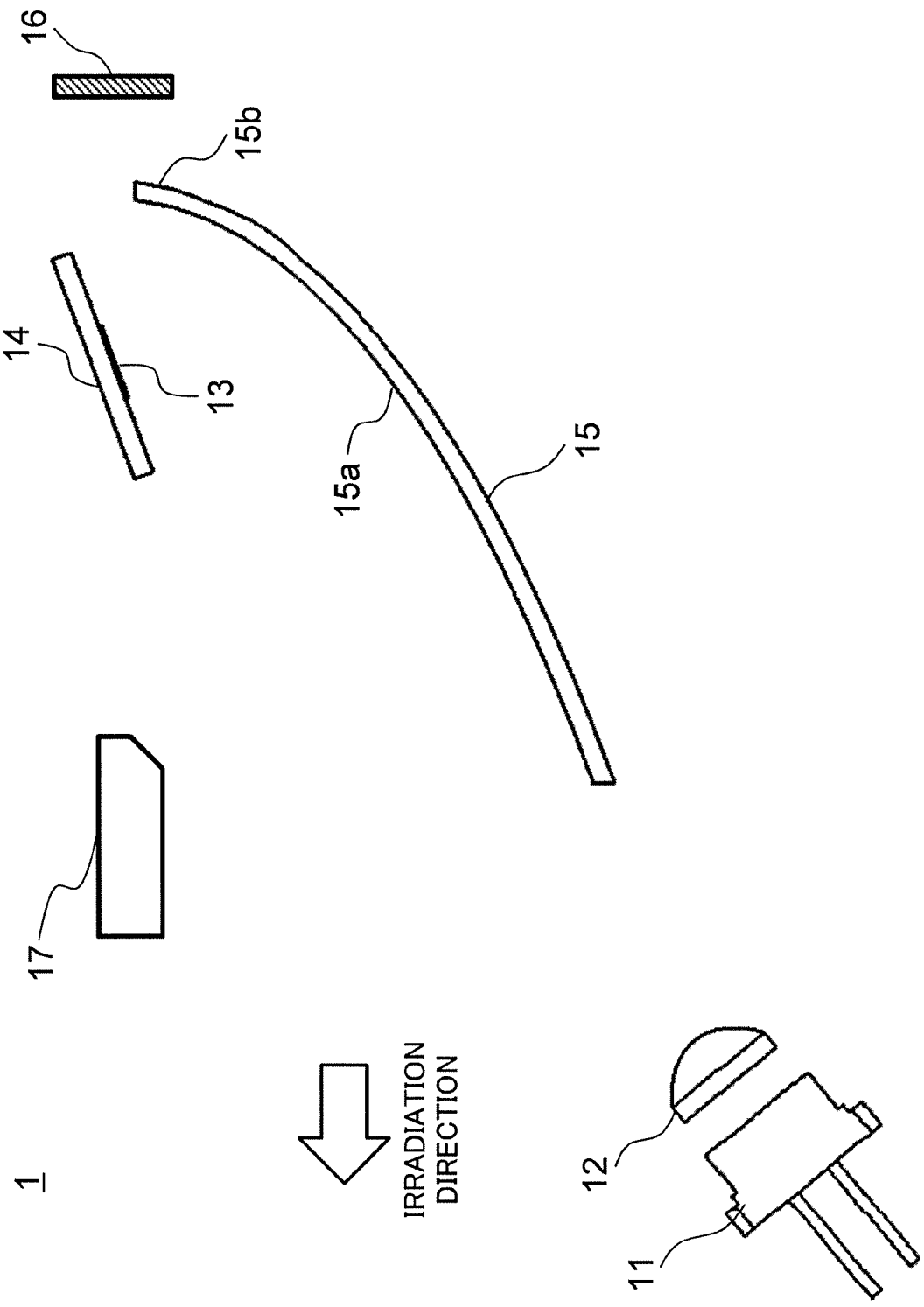

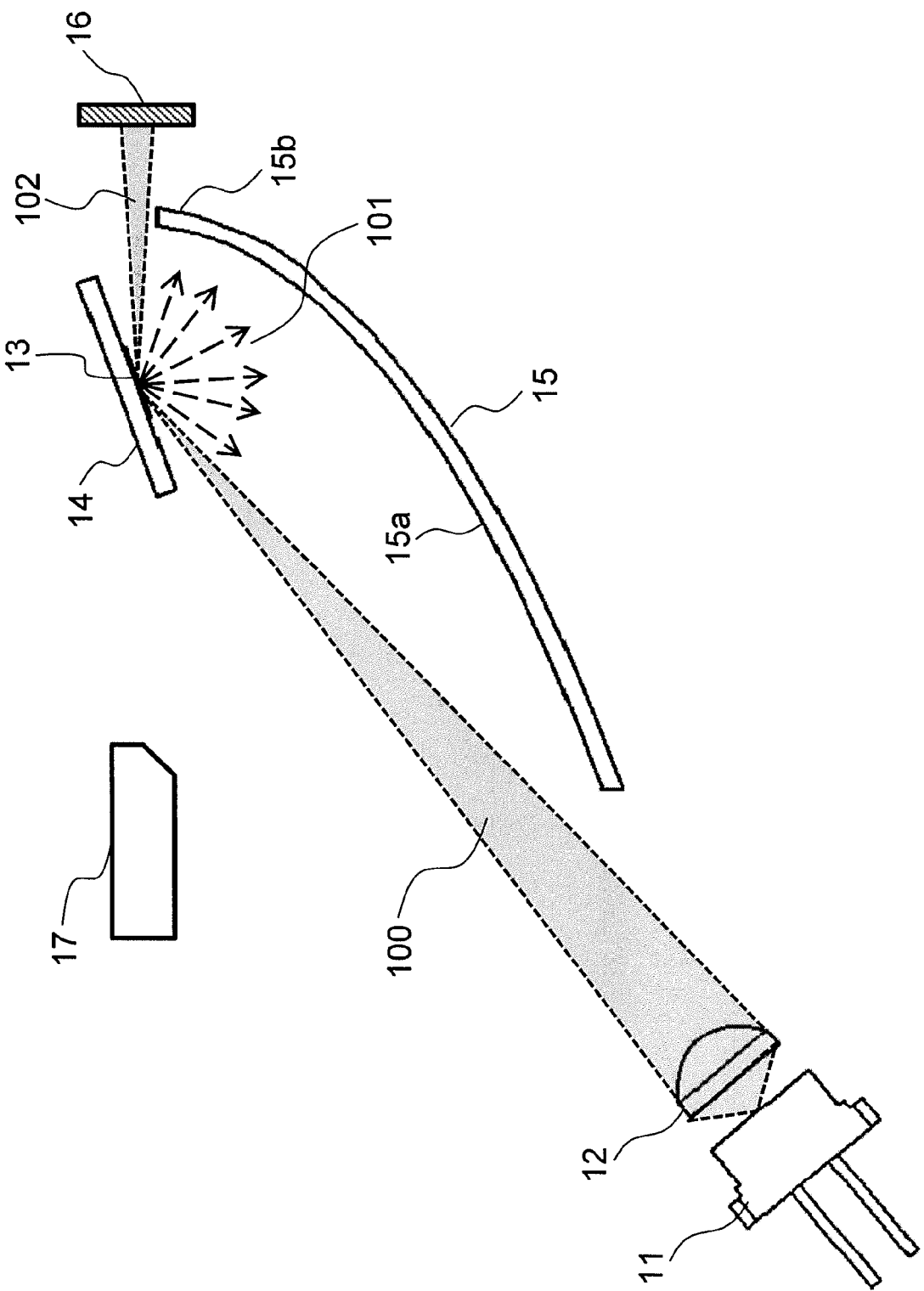

VEHICLE LAMP HAVING A LASER EMITTING ELEMENT

CROSS-REFERENCE TO RELATED APPLICATIONS

This application is the U.S. National Phase of PCT/JP2013/083777 dated Dec. 17, 2013, which claims priority from Japanese Patent Application No. 2013-001457 dated Jan. 9, 2013. The subject matter of each is incorporated herein by reference in entirety.

TECHNICAL FIELD

The present invention relates to a vehicle lamp using a laser emitting element.

BACKGROUND ART

In recent years, as vehicle lamps such as vehicle headlights, in order to reduce an energy consumption of a light source, products using light-emitting diodes (LED) or laser diodes (LD) have been proposed, and some of the products are practically used. In particular, since an LD light source has high phototransformation efficiency and a small light-emitting area, the LD light source is advantageous in terms of a reduction in size of a lamp. A vehicle lamp using an LD light source is configured to cause an LD element to irradiate excitation light (for example, blue laser light) to a phosphor and to mix light (for example, yellow light) generated by exciting the phosphor with the excitation light in color so as to emit visible light (for example, white light). For example, PTL 1 describes an illumination device including an excitation light source emitting excitation light having an oscillation wavelength in a blue-violet region, a light-emitting unit which receives the excitation light emitted from the excitation light source to emit light, and a transmitting filter which blocks a coherent component included in the excitation light and transmits an incoherent component thereof.

CITATION LIST

Patent Literature

PTL 1: Japanese Patent Application Laid-Open No. 2012-99281

SUMMARY OF INVENTION

Technical Problem

As in PTL 1, when laser light is used as a light source (excitation light source), the laser light which is directly emitted outside as illumination light may damage human eyes, and must be prevented. In PTL 1, as a countermeasure against this, a configuration in which a transmitting filter is arranged to block a coherent component included in excitation light to suppress illumination light from damaging human eyes with illumination light. However, since the transmitting filter naturally perfectly blocks the coherent component and transmits an incoherent component on the other hand, the transmitting filter is required to be an accurate product having high reliability.

It is an object of the present invention to, in a vehicle lamp using a laser light source as excitation light, reliably prevent laser light from leaking outside as a part of illumination light.

Solution to Problems

A vehicle lamp according to the present invention includes a semiconductor light-emitting element emitting laser light, a phosphor which receives the laser light emitted from the semiconductor light-emitting element as excitation light to emit visible light, a reflector which is disposed to face the phosphor from the rear side to the lower side thereof and reflects the visible light emitted from the phosphor forward to emit illumination light, and an absorbing member which is disposed on the back of the phosphor and absorbs, of the excitation light, excitation light regularly reflected by a surface of the phosphor. The phosphor is formed on a metal plate, the metal plate has a surface which is inclined to cause the excitation light regularly reflected by the surface of the phosphor to be incident on the absorbing member, and an upper end portion of the reflector is disposed at a position lower than a vertical position of the phosphor to prevent the regularly reflected excitation light from being incident on the upper end portion.

Advantageous Effects of Invention

According to the present invention, since excitation light (laser light) regularly reflected by the surface of the phosphor is configured not to be incident on the reflector, the excitation light can be reliably prevented from being emitted forward as illumination light. At this time, since an upper end position of the reflector need only be changed to arbitrarily dispose an absorbing member, a simple structure can be achieved.

BRIEF DESCRIPTION OF DRAWINGS

FIG. 1A is a perspective view showing a configuration of a vehicle lamp according to a first embodiment.

FIG. 1B is a side sectional view showing the configuration of the vehicle lamp according to the first embodiment.

FIG. 2B is a side sectional view showing the optical path of excitation light in the first embodiment.

DESCRIPTION OF EMBODIMENTS

Figure 2A:
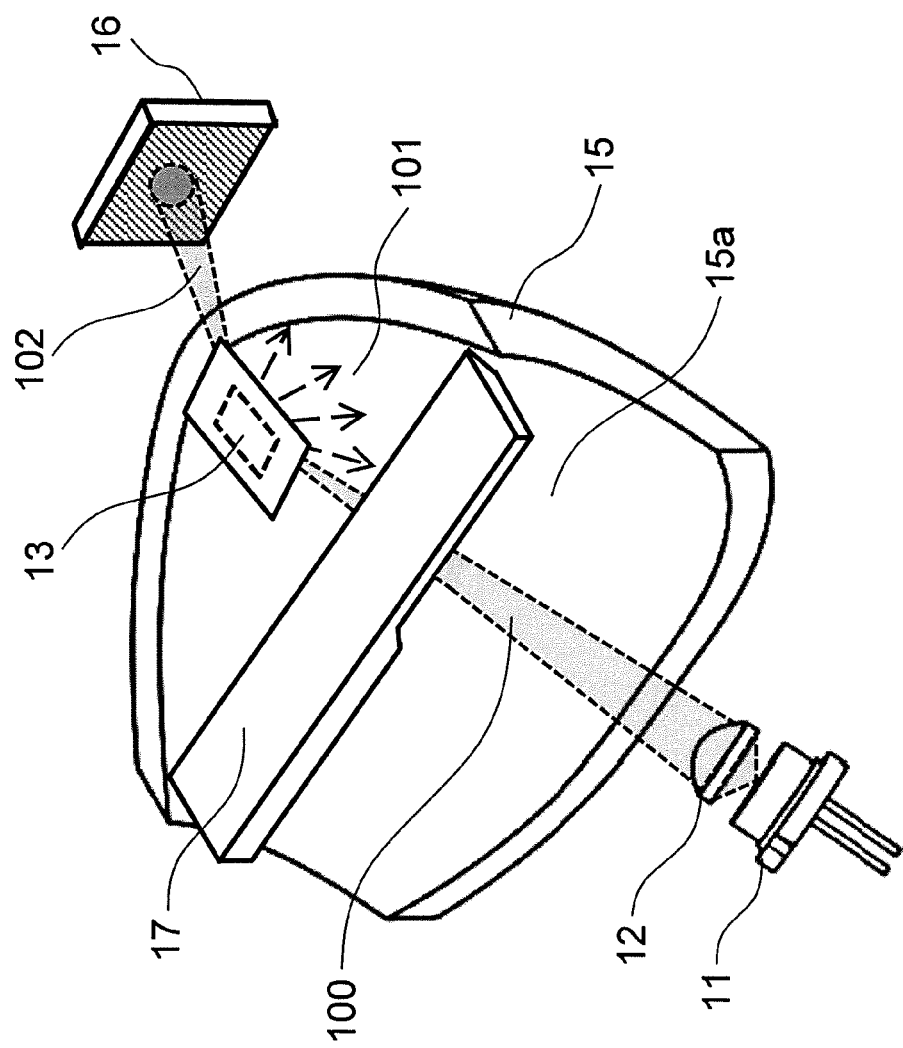
FIG. 2A is a perspective view showing an optical path of excitation light in the first embodiment.

Embodiments of the present invention will be described below with reference to the accompanying drawings.

First Embodiment

FIG. 1A and FIG. 1B are a perspective view and a side sectional view showing a configuration of a vehicle lamp according to a first embodiment of the present invention, respectively.

A vehicle lamp 1 is a so-called projector-type lamp which includes a semiconductor light-emitting element 11, a condenser lens 12, a phosphor 13, a metal plate 14, a reflector 15, an absorbing member 16, and a shade 17. A laser diode (LD) is used as the semiconductor light-emitting element 11 serving as a light source to emit blue laser light serving as excitation light of the phosphor 13. The condenser lens 12 is disposed on an emission side of the semiconductor light-emitting element 11 to condense excitation light (blue laser light) emitted from the semiconductor light-emitting element 11 on the surface of the phosphor 13 disposed above the condenser lens 12.

The phosphor 13 is formed in a partial region on the metal plate 14. The phosphor 13 is a luminescence material which is excited to generate yellow light when the luminescence material receives excitation light emitted from the semiconductor light-emitting element 11, and has a coarsened surface to scatter incident light. For this reason, the phosphor 13 receives excitation light to generate fluorescent light (yellow light), and the fluorescent light is mixed in color with the excitation light (blue light) scattered by the phosphor 13. As a result, white light is emitted from the phosphor 13. In this manner, the phosphor 13 emits white light like a point source having a size almost equal to that of a condensing spot of excitation light.

The metal plate 14 holds the phosphor 13 and has a mirror surface to reflect the white light generated from the phosphor 13 onto the reflector 15 side. The metal plate 14 holding the phosphor 13 is inclined with respect to the horizontal direction, and is arranged to guide a component, of the excitation light from the semiconductor light-emitting element 11, regularly reflected by the surface of the phosphor 13 toward the rear absorbing member 16.

The reflector 15 is formed to have a curved-plate shape having an opening on an upper obliquely front side, and is disposed to face the lower side of the phosphor 13. The upper surface of the reflector 15 is a reflecting surface 15a which reflects the white light emitted from the phosphor 13 forward. The reflecting surface 15a is formed to have a freely curved shape to obtain a desired luminous intensity distribution, for example, a shape based on a parabolic curve. This reflecting surface 15a is disposed to face the phosphor 13 from the back side to the lower side of the phosphor 13 to irradiate the white light emitted from the phosphor 13 in the forward direction of the vehicle. At this time, an upper end portion 15b of the reflector 15 is disposed at a position lower than a vertical position of the phosphor 13 such that the excitation light from the semiconductor light-emitting element 11 regularly reflected by the phosphor 13 is prevented from being incident on the reflecting surface 15a.

The absorbing member 16 is a light-absorbing material which absorbs incident excitation light to absorb the excitation light emitted from the semiconductor light-emitting element 11 and regularly reflected by the phosphor 13. As the absorbing member 16, an inorganic material which is less deteriorated by absorbing the excitation light is used.

The shade 17 is a light-shielding member disposed in front of the phosphor 13. The shade 17 partially blocks the white light (illumination light) reflected by the reflecting surface 15a of the reflector 15 to form a cut-off line of a low beam serving as vehicle illumination light.

FIG. 2A and FIG. 2B are a perspective view and a side sectional view showing an optical path of excitation light of the vehicle lamp 1, respectively. When excitation light (blue laser light) 100 is emitted from the semiconductor light-emitting element 11, the excitation light is condensed by the condenser lens 12 and incident on the surface of the phosphor 13 from the front obliquely lower side.

Most of the excitation light being incident on the phosphor 13 is radially emitted downward as scattered light 101. However, the excitation light is partially regularly reflected by the surface of the phosphor 13 and travels to a horizontal rear side as regularly reflected light 102. Since the regularly reflected light 102 holds the coherence of the blue laser light emitted from the semiconductor light-emitting element 11, the regularly reflected light 102 which is directly emitted outside may damage human eyes. This embodiment employs a structure in which the regularly reflected light 102 traveling from the phosphor 13 to the rear side thereof is incident on the absorbing member 16 and absorbed by the absorbing member 16 without hitting on the reflector 15. According to this structure, the blue laser light (coherent light) emitted from the semiconductor light-emitting element 11 is reflected by the reflector 15 and can be reliably prevented from being emitted outside.

Figure 3:
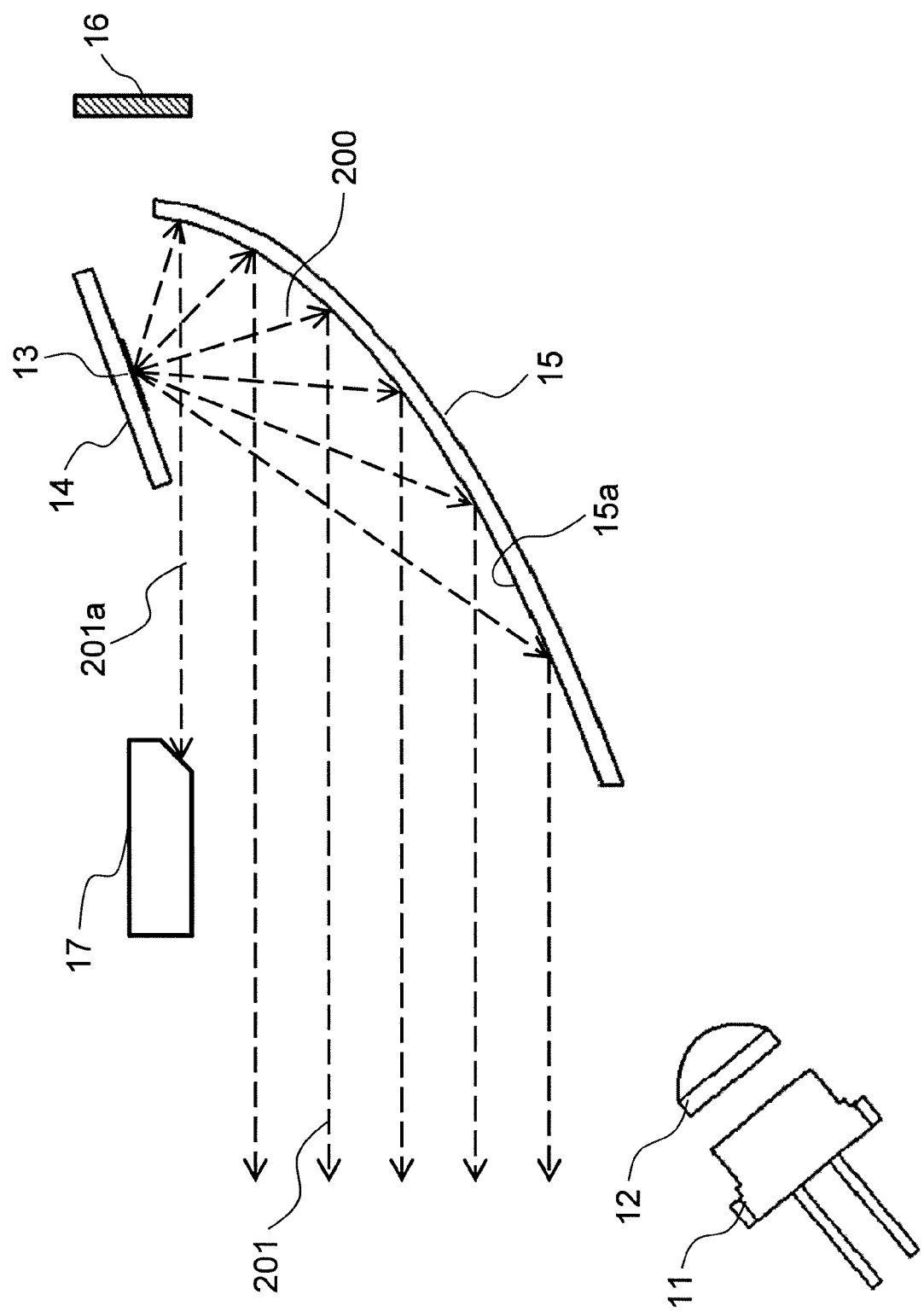
FIG. 3 is a side sectional view showing an optical path of illumination light in the first embodiment.

FIG. 3 is a side sectional view showing an optical path of illumination light of the vehicle light 1. Once the phosphor 13 receives the excitation light 100, the phosphor 13 generates yellow fluorescent light, and the excitation light 100 is scattered by the phosphor 13 to become the scattered light 101 that is blue light. The fluorescent light and the scattered light 101 are mixed in color with each other to emit white light 200 downward from the phosphor 13. The metal plate 14 holding the phosphor 13 has a mirror surface to cause the generated white light 200 to travel to the lower reflector 15.

The white light 200 is reflected forward by the reflecting surface 15a of the curved-plate-shaped reflector 15 to become illumination light 201 for the front side of the vehicle. At this time, the reflecting surface 15a has a freely curved shape, and the illumination light 201 is emitted to obtain a desired luminous intensity distribution. An upper edge 201a of the illumination light 201 is blocked by the shade 17 to form a low beam in which illumination light toward the upper side a cut-off line is blocked.

As described above, according to the vehicle lamp 1 according to the embodiment, the upper end portion 15b of the reflector 15 is disposed at a position lower than the vertical position of the phosphor 13 to prevent the excitation light emitted from the semiconductor light-emitting element 11 and regularly reflected by the phosphor 13 from being incident on the reflecting surface 15a of the reflector 15. More specifically, the excitation light emitted from the semiconductor light-emitting element 11 and regularly reflected by the phosphor 13 is configured to be guided to the rear side without hitting on the reflecting surface 15a of the reflector 15 and absorbed by the absorbing member 16. In this manner, the excitation light serving as laser light (coherent light) can be reliably prevented from being emitted in the forward direction of the vehicle lamp. The structure according to the embodiment can be achieved with a simple structure because the upper end position of the reflector 15 need only be changed and the absorbing member 16 is disposed as needed.

Second Embodiment

Figure 4:
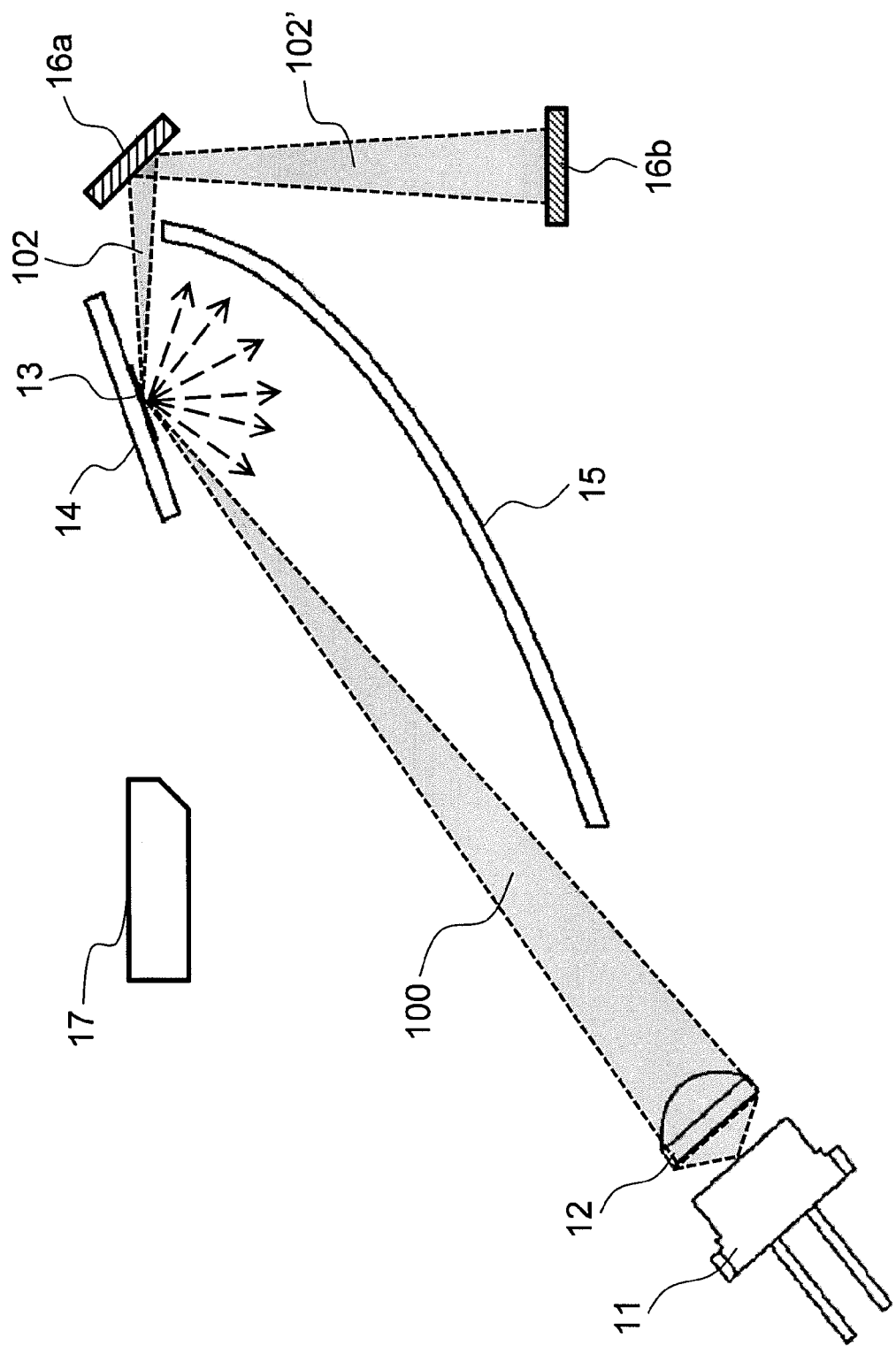
FIG. 4 is a side sectional view showing a configuration of a vehicle lamp and an optical path of excitation light in a second embodiment.

FIG. 4 is a side sectional view showing a configuration of a vehicle lamp and an optical path of excitation light in a second embodiment. The same reference numerals as those in the first embodiment (FIG. 2B) denote the same constituent elements as those in the second embodiment, and a description thereof will not be given.

In the second embodiment, two absorbing members 16a and 16b which absorb excitation light are used, and the other configurations are the same as those in the first embodiment. The first absorbing member 16a is disposed at a position where the absorbing member 16a receives the regularly reflected light 102 reflected by the phosphor 13 and traveling toward the rear side to have an inclined incident surface. For example, when the first absorbing member 16a is inclined forward at an angle of 45 degrees. Furthermore, the second absorbing member 16b is disposed below the first absorbing member 16a. According to the configuration, even though there is reflected light 102' which cannot be completely absorbed by the first absorbing member 16a and is reflected downward, the reflected light 102' is absorbed by the second absorbing member 16b. Thus, blue laser light (coherent light) generated by the semiconductor light-emitting element 11 can be reliably absorbed. The absorbing members may also be configured by three or more absorbing members, as a matter of course.

Third Embodiment

Figure 5:
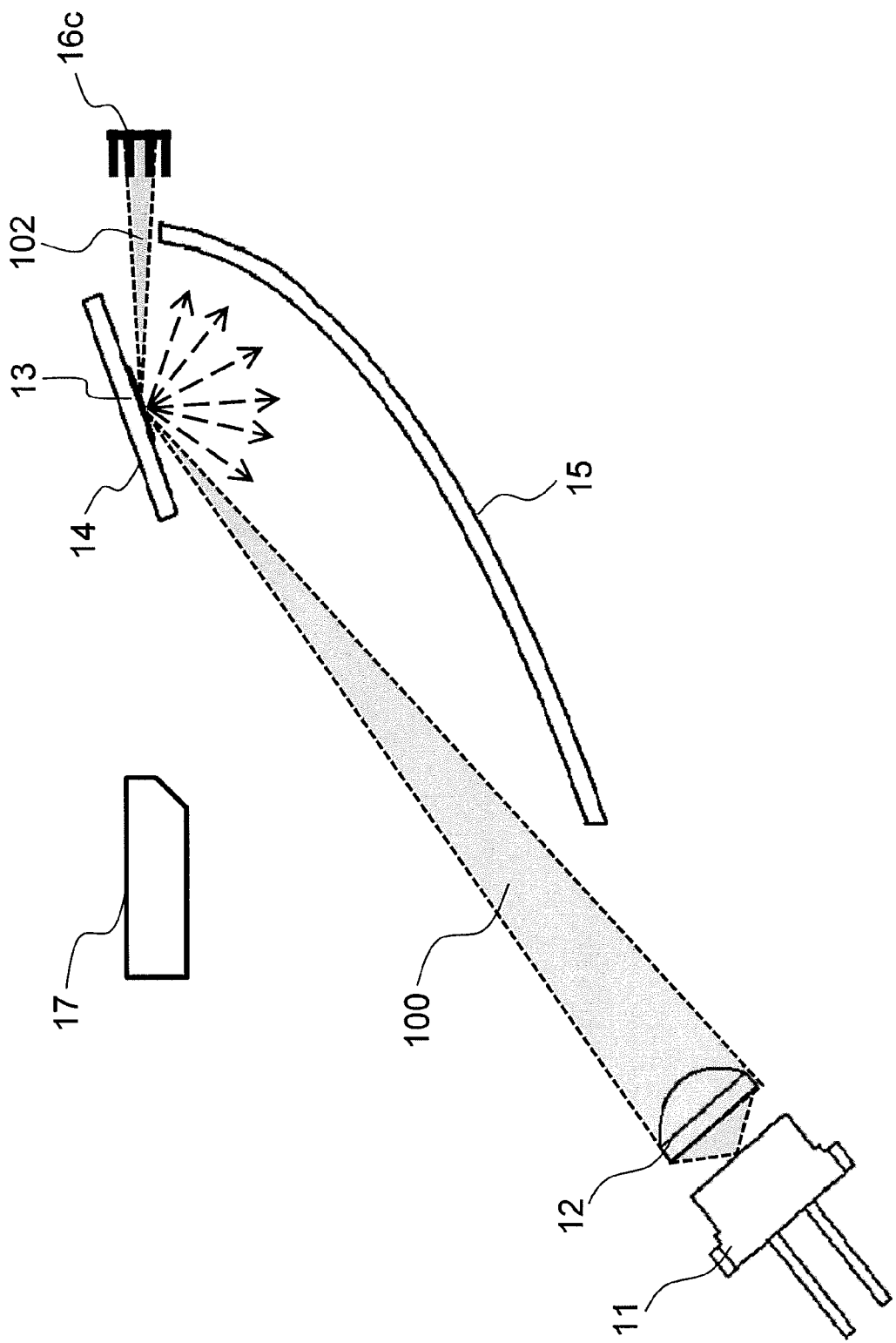
FIG. 5 is a side sectional view showing a configuration of a vehicle lamp and an optical path of excitation light in a third embodiment.

FIG. 5 is a side sectional view showing a configuration of a vehicle lamp and an optical path of excitation light in a third embodiment. The same reference numerals as those in the first embodiment (FIG. 2B) denote the same constituent elements as those in the third embodiment, and a description thereof will not be given.

In the third embodiment, a comb-shaped absorbing member 16c as an absorbing member, and the other configurations as the same as those in the first embodiment. When an incident-side shape of the absorbing member 16c is a comb-like shape, the regularly reflected light 102 being incident in nonparallel is attenuated by being absorbed in the comb teeth two or more times to make it possible to improve the absorbability of the absorbing member 16c. In this example, although the comb-shaped absorbing member is used, when the incident surface is made an uneven surface, even though the regularly reflected light 102 cannot be completely absorbed, the regularly reflected light 102 is reflected as scattered light to obtain a higher level of safety.

Fourth Embodiment

Figure 6:
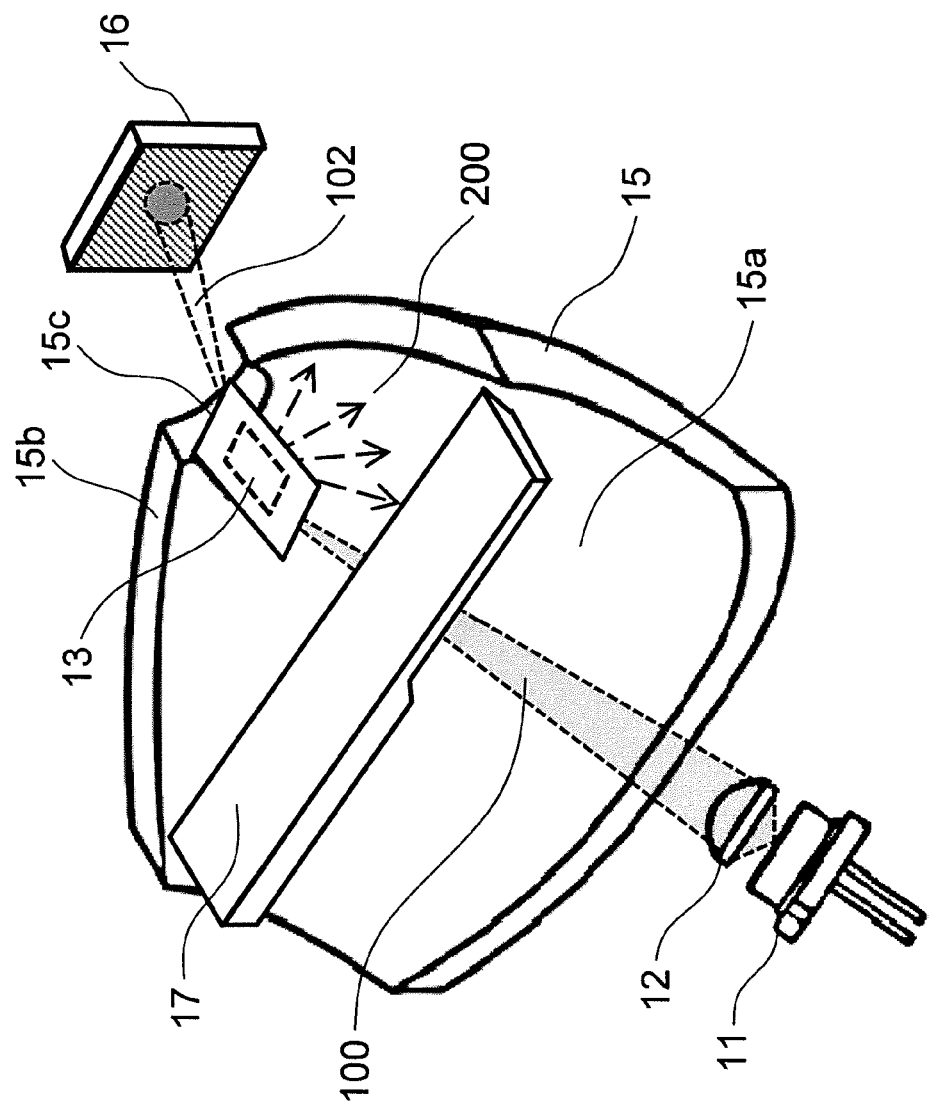
FIG. 6 is a perspective view showing a configuration of a vehicle lamp and an optical path of excitation light in a fourth embodiment.

FIG. 6 is a perspective view showing a configuration of a vehicle lamp and an optical path of excitation light in a fourth embodiment. The same reference numerals as those in the first embodiment (FIG. 2A) denote the same constituent elements as those in the fourth embodiment, and a description thereof will not be given.

In the fourth embodiment, a notch 15c is formed in the upper end portion 15b of the reflector 15 to cause the excitation light 102 regularly reflected by the phosphor 13 to pass through the notch 15c, and the excitation light 102 is guided to the rear absorbing member 16. According to the configuration, in comparison with the first embodiment (FIG. 2), the reflector 15 is allowed to be disposed such that the upper end portion 15b of the reflector 15 is extended in height over the vertical position of the phosphor 13. Thus, of the white light 200 (scattered light 101) emitted from the phosphor 13, a nearly horizontal component traveling backward can be reflected forward by the reflecting surface 15a of the reflector 15, and the light intensity of illumination light can be increased. The size of the notch 15c is made larger than the size of a beam of the excitation light 102. Alternatively, a through hole may be used in place of the notch 15c.

Fifth Embodiment

Figure 7:
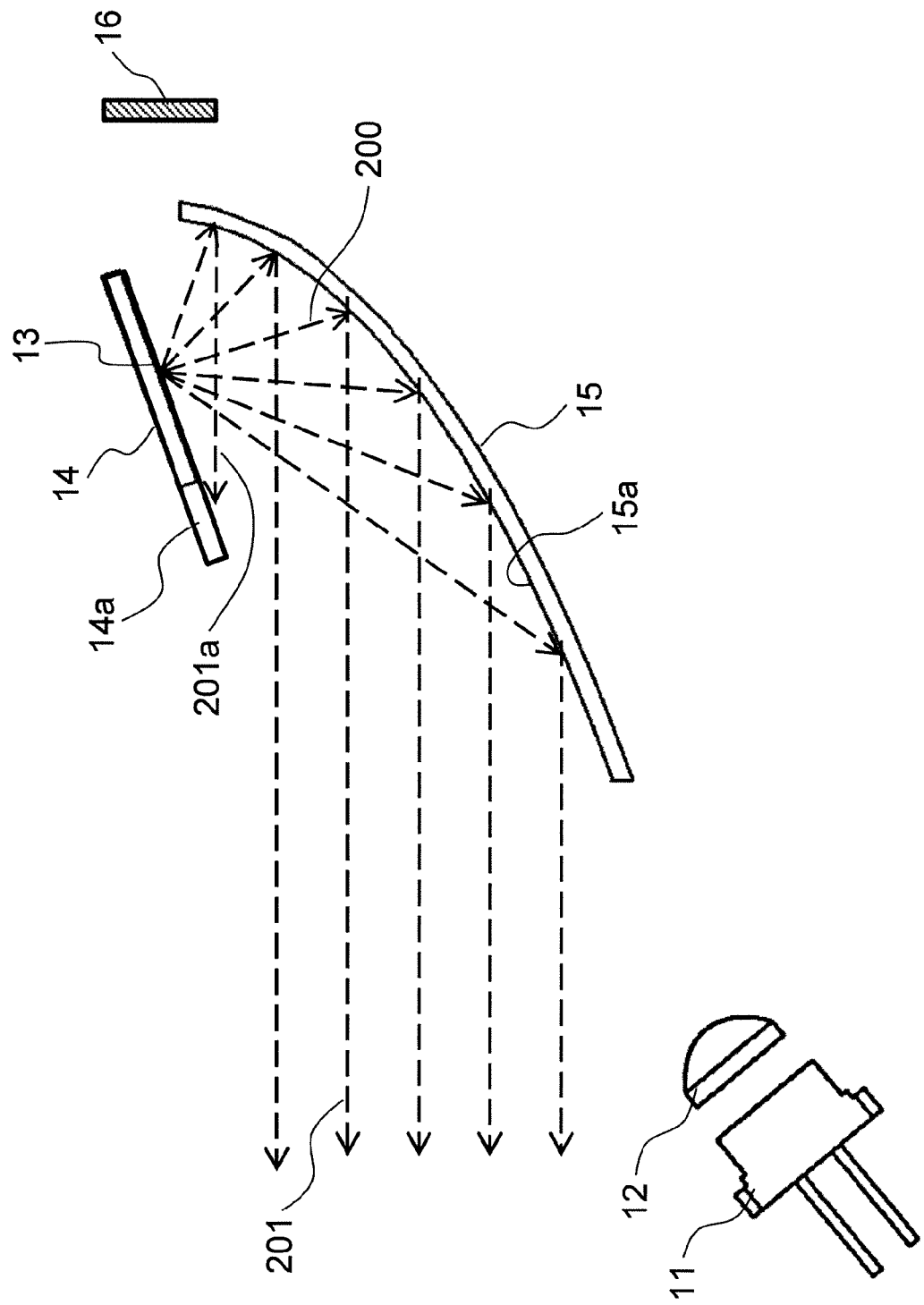
FIG. 7 is a side sectional view showing a configuration of a vehicle lamp and an optical path of illumination light in a fifth embodiment.

FIG. 7 is a side sectional view showing a configuration of a vehicle lamp and an optical path of illumination light in a fifth embodiment. The same reference numerals as those in the first embodiment (FIG. 3) denote the same parts as those in the fifth embodiment, and a description thereof will not be given.

In the fifth embodiment, without disposing the shade 17, an extended portion 14a is disposed at the lower end of the metal plate 14 to function as a shade. Since the upper edge 201a of the illumination light 201 is blocked by the extended portion 14a, a low beam in which illumination light toward the upper side a cut-off line is blocked is formed. In the embodiment, since the structure does not include a shade, the number of constituent parts can be advantageously reduced.

In each of the embodiments, excitation light (laser light) generated by the semiconductor light-emitting element 11 is blued, and the fluorescent light generated by the phosphor 13 is yellowed, and both the lights are mixed with each other in color to obtain white light. However, the color combination between the excitation light and the fluorescent light is not limited to the combination described above. Depending on applications, even though visible light except for white light is used as the illumination light, the invention can be achieved.

The present invention is not limited to the embodiments described above and includes various modifications. For example, the embodiments described above are explained to understandably explain the present invention. Each of the embodiments need not always include all the configurations described above. Some configurations of a certain embodiment can be partially replaced with corresponding configurations of another embodiment, and, to the configurations of a certain embodiment, some configurations of another embodiment can also be added. With respect to some of the configurations of each of the embodiments, other configurations can be added, deleted, and replaced.

REFERENCE SIGNS LIST

1 . . . vehicle lamp,
11 . . . semiconductor light-emitting element (laser diode),
12 . . . condenser lens
13 . . . phosphor
14 . . . metal plate
14a . . . extended portion of metal plate
15 . . . reflector
15a . . . reflecting surface
15b . . . upper end portion
15c . . . notch
16, 16a, 16b, 16c . . . absorbing member
17 . . . shade
100 . . . excitation light (laser light)
101 . . . scattered light of excitation light
102 . . . regularly reflected light of excitation light
200 . . . white light
201 . . . illumination light
201a . . . upper edge of illumination light.

The invention claimed is:
1. A vehicle lamp which emits illumination light by using laser light as excitation light, comprising:
a semiconductor light-emitting element emitting laser light;

a phosphor which receives the laser light emitted from the semiconductor light-emitting element as excitation light to emit visible light;

a reflector which is disposed to face the phosphor from the rear side to the lower side thereof and reflects the visible light emitted from the phosphor forward to emit illumination light; and an absorbing member which is disposed on the back of the phosphor and absorbs, of the excitation light, excitation light regularly reflected by a surface of the phosphor, wherein the phosphor is formed on a metal plate, the metal plate has a surface which is inclined to cause the excitation light regularly reflected by the surface of the phosphor to be incident on the absorbing member, and the phosphor and an incident portion of the absorbing member, which receives the regularly reflected excitation light, are disposed at a position higher in a vertical direction than that of an upper end portion of the reflector.

2. The vehicle lamp according to claim 1, further comprising a second absorbing member.

3. The vehicle lamp according to claim 1, wherein the absorbing member is configured by an absorbing member which is comb-shaped on an incident side.

4. The vehicle lamp according to claim 1, wherein an extended portion is formed at a lower end portion of the metal plate, and the extended portion has a shade function of blocking an upper edge of the illumination light reflected by the reflector.

5. A vehicle lamp which emits illumination light by using laser light as excitation light, comprising:

a semiconductor light-emitting element emitting laser light;

a phosphor which receives the laser light emitted from the semiconductor light-emitting element as excitation light to emit visible light;

a reflector which is disposed to face the phosphor from the rear side to the lower side thereof and reflects the visible light emitted from the phosphor forward to emit illumination light; and an absorbing member which is disposed on the back of the phosphor and absorbs, of the excitation light, excitation light regularly reflected by a surface of the phosphor, wherein the phosphor is formed on a metal plate, the metal plate has a surface which is inclined to cause the excitation light regularly reflected by the surface of the phosphor to be incident on the absorbing member, a notch to cause the excitation light regularly reflected by the surface of the phosphor to pass is formed in an upper end portion of the reflector, and the phosphor and an incident portion of the absorbing member, which receives the regularly reflected excitation light, are disposed at a position higher in a vertical direction than that of an upper end portion of the notch.

6. The vehicle lamp according to claim 5, further comprising a second absorbing member.

7. The vehicle lamp according to claim 5, wherein the absorbing member is configured by an absorbing member which is comb-shaped on an incident side.

8. The vehicle lamp according to claim 5, wherein an extended portion is formed at a lower end portion of the metal plate, and the extended portion has a shade function of blocking an upper edge of the illumination light reflected by the reflector.

* * * * *